United States Patent
Koto (10) Patent No.: US 6,310,826 B2
(45) Date of Patent: Oct. 30, 2001

(54) SEMICONDUCTOR DEVICE HAVING A TEST CIRCUIT

(75) Inventor: Tomohiko Koto, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/761,727

(22) Filed: Jan. 18, 2001

(30) Foreign Application Priority Data

Jan. 20, 2000 (JP) .................................................. 12-011626

(51) Int. Cl.[7] .................................................. G11C 8/00
(52) U.S. Cl. .................................................. 365/233; 365/201
(58) Field of Search ....................................... 365/233, 201, 365/189.02, 230.02

(56) References Cited

U.S. PATENT DOCUMENTS 5,991,232 * 11/1999 Matsumura et al. .................. 365/233

FOREIGN PATENT DOCUMENTS 11-101855   4/1999   (JP) .
2000-48599  2/2000   (JP) .

* cited by examiner

Primary Examiner—Vu A. Le
(74) Attorney, Agent, or Firm—Arent, Fox, Kintner, Plotkin & Kahn, PLLC

(57) ABSTRACT

A semiconductor memory device includes a memory circuit from which data is read in correspondence with a first reference clock signal. A multiplexer outputs the data read from the memory circuit in correspondence with the second reference clock signal. A comparison determination circuit receives the data read from the memory circuit via the multiplexer and compares the read data with an expected data value in correspondence with the second reference clock signal to generate determination result data.

12 Claims, 10 Drawing Sheets

SEMICONDUCTOR DEVICE HAVING A TEST CIRCUIT

BACKGROUND OF THE INVENTION

The present invention relates to a semiconductor device having a test circuit, and more particularly, to a test circuit of a synchronous DRAM that writes and reads data in synchronism with a clock signal.

To increase the operational speed of SDRAMs, double data rate (DDR)-SDRAMs are now being used instead of single data rate (SDR)-SDRAMs. The rate for reading and writing data in the DDR-SDRAM is twice as great as that of the SDR-SDRAM.

Figure 1:
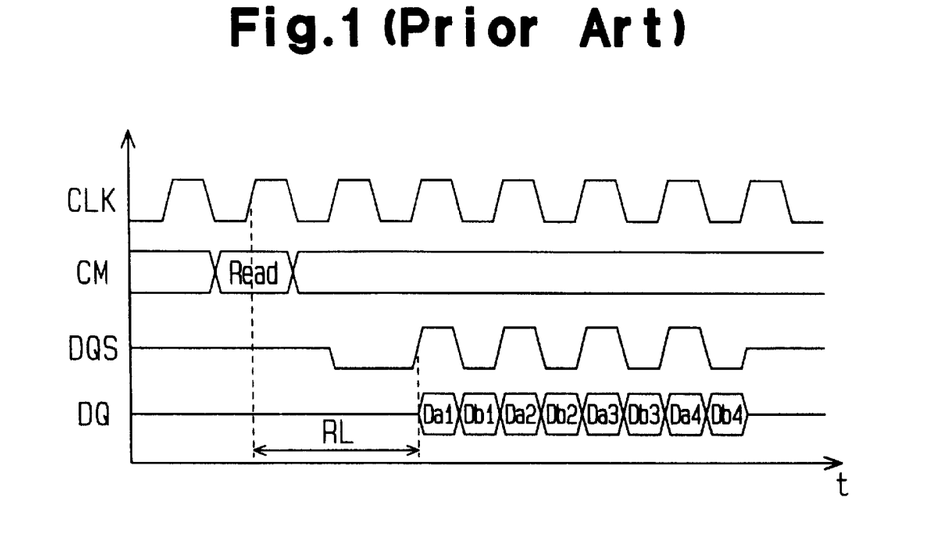
FIG. 1 is a chart showing signal waveforms during a read mode in a prior art DDR-SDRAM.

With reference to FIG. 1, when a DDR-SDRAM receives an operation control signal CM (read command), the DDR-SDRAM acquires the read command when a first reference clock signal CLK goes high. When a predetermined read latency RL elapses, the DDR-SDRAM generates a second reference clock signal DQS and output data DQ.

In this state, the output data DQ is output in synchronism with the leading edge and trailing edge of the second reference clock signal DQS. Thus, the data rate of the DDR-SDRAM is twice as great as that of the SDR-SDRAM.

The DDR-SDRAM receives the second reference clock signal DQS and input data DQ during a write mode. The DDR-SDRAM performs data writing in synchronism with the leading edge and trailing edge of the second reference clock signal DQS.

When testing the DDR-SDRAM, the data rate of the DDR-SDRAM may be higher than that of a conventional tester. Thus, to match the data rate of the DDR-SDRAM with that of a tester, the DDR-SDRAM is provided with a test circuit.

Figure 2:
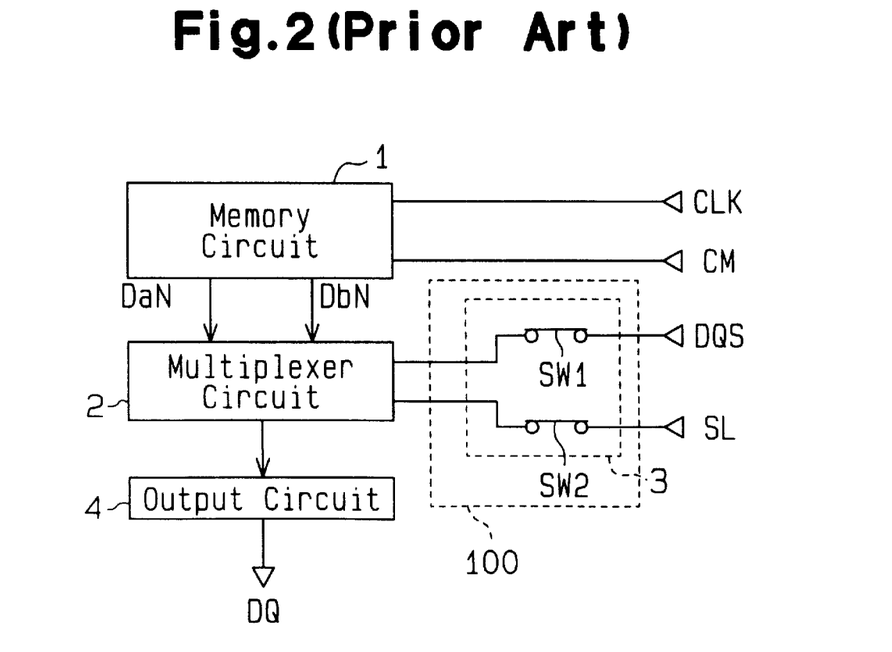
FIG. 2 is a schematic block diagram of a DDR-SDRAM having a prior art test circuit.

With reference to FIG. 2, a typical test circuit 100 includes a test mode switching circuit 3. Data DaN is read in parallel with data DbN from a memory circuit 1. The data DaN, DbN is provided to the multiplexer circuit 2 in accordance with the reference clock signal CLK and the operation control signal CM.

The multiplexer circuit 2 is controlled by the test mode switching circuit 3, which includes switch circuits SW1, SW2. During a normal mode, the second reference clock signal DQS is provided to the multiplexer circuit 2 via the switch circuit SW1. During a test mode, the second reference clock signal DQS and a selection signal SL are provided to the multiplexer circuit 2 via the switch circuits SW1, SW2, respectively. The selection signal SL selects read data DaN or read data DbN.

With reference to FIG. 1, during the normal mode, the multiplexer circuit 2 alternately provides the read data DaN and DbN to the output circuit 4 in synchronism with the leading and trailing edges of the second reference clock signal DQS. The output circuit 4 outputs the read data DaN, DbN as the output data DQ.

Figure 3:
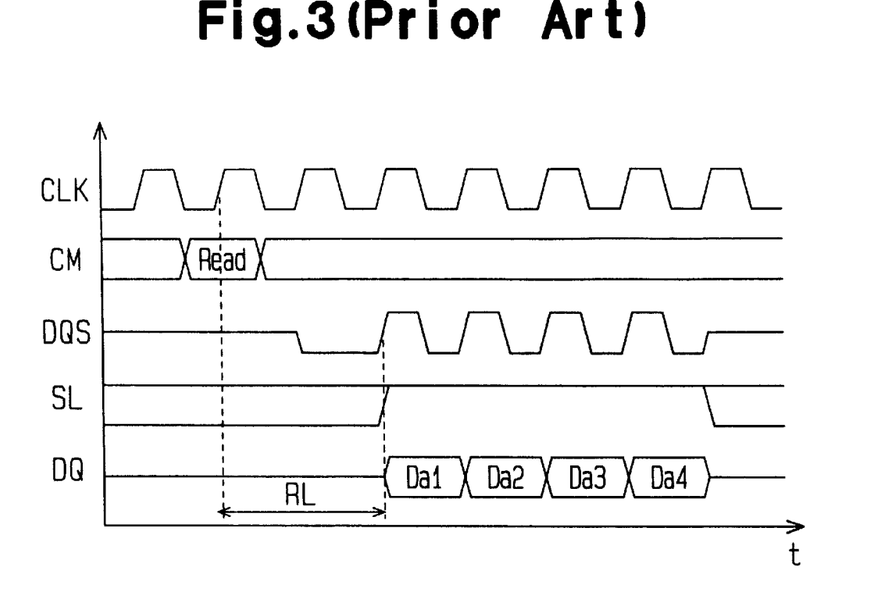
FIG. 3 is a chart showing waveforms of signals in the prior art test circuit of FIG. 2.

Referring to FIG. 3, when the selection signal SL received by the multiplexer circuit 2 goes high during the test mode, the multiplexer circuit 2 provides the read data DaN to the output circuit 4 when the second reference clock signal DQS goes high. The output circuit 4 outputs the read data DaN as the output data DQ.

When the selection signal SL goes low during the test mode, the multiplexer circuit 2 provides the read data DbN to the output circuit 4 when the second reference clock signal DQS goes high. The output circuit 4 outputs the read data DbN as the output data DQ.

In this manner, the test circuit 100 provides the output data DQ to a tester at a data rate that is one half of the data rate of the DDR-SDRAM. The tester compares data prewritten to the memory circuit 1 with the output data DQ and determines whether the DDR-SDRAM is functioning normally.

However, since the data rate of the output data DQ generated by the test circuit 100 is one half of that of the DDR-SDRAM, the time required to read cell information from every memory cell of the memory circuit 1 is twice as long as the time required for the output data DQ to be generated at the normal data rate of the DDR-SDRAM. This prolongs test time and increases test costs.

Further, the test circuit 100 is not capable of detecting whether the DDR-SDRAM is outputting the output data DQ at the normal data rate (i.e., double data rate).

Japanese Unexamined Patent Publication No. 11-101855 describes a test circuit having a frequency divider. The frequency divider divides a reference clock signal, which is provided from an external device, to generate a divisional clock signal. The divisional clock signal is used as the second reference signal to decrease the data rate of the test circuit.

However, when the operational time delay of the frequency divider results in a time lag between the leading edge of the reference clock signal and the leading edge of the divisional clock signal, the tester cannot perform proper comparison of the write data and the read data. To eliminate the time lag between the divisional clock signal and the reference clock signal, a control circuit may be incorporated in the test circuit. However, the control circuit would increase the circuit area of the test circuit. The frequency divider would also increase the circuit area of the test circuit since the frequency divider includes a relatively large number of elements.

SUMMARY OF THE INVENTION

It is an object of the present invention to provide a semiconductor device having a test circuit that does not require an increase in the circuit area and shortens the test time.

To achieve the above object, the present invention provides a semiconductor device including an internal circuit for generating data. An I/O circuit receives the data and outputs output data in correspondence with a rising edge and a falling edge of a reference clock signal. A comparison determination circuit receives the output data, compares the output data with an expected data value, and generates determination result data in correspondence with the rising edge and the falling edge of the reference clock signal.

To achieve the above object, the present invention further provides a semiconductor device including an internal circuit for generating data in correspondence with a first reference clock signal. An I/O circuit receives the data and outputs output data in correspondence with a rising edge and a falling edge of a second reference clock signal. A comparison determination circuit receives the output data, compares the output data with an expected data value, and generates determination result data in correspondence with the rising edge and the falling edge of the second reference clock signal.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

In the drawings, like numerals are used for like elements throughout.

Figure 4:
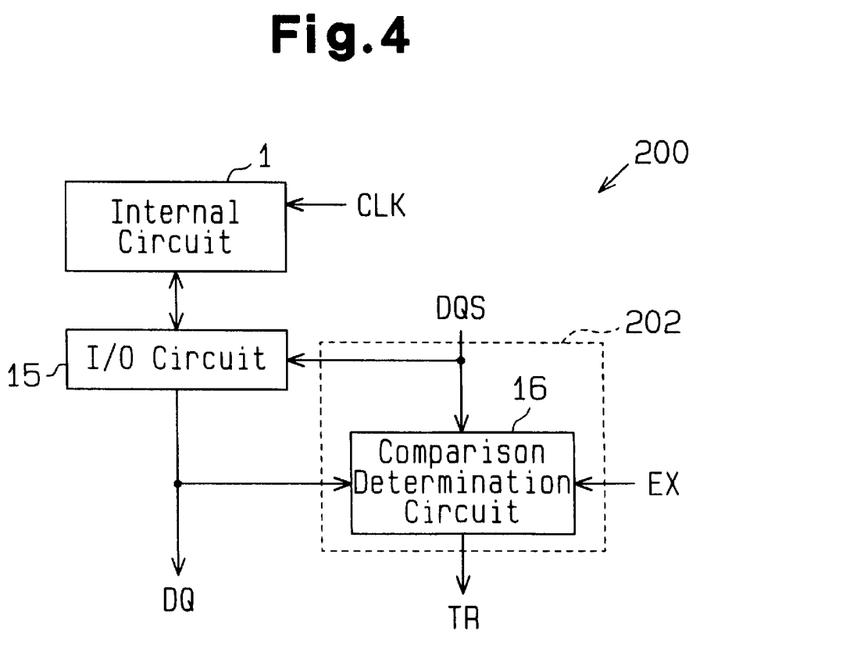
FIG. 4 is a schematic block diagram of a semiconductor memory according to a first embodiment of the present invention.

With reference to FIG. 4, a semiconductor device 200 according to a first embodiment of the present invention has an internal circuit 1 and a test circuit 202. The test circuit 202 includes a comparison determination circuit 16. The internal circuit 1 operates in correspondence with a first reference clock signal CLK. In accordance with a second reference clock signal DQS, the I/O circuit 15 receives data DQ from the internal circuit 1 and outputs the data DQ. The I/O circuit 15 also provides data to the internal circuit 1 in accordance with the second reference clock signal DQS. In correspondence with the second reference clock signal DQS, the comparison determination circuit 16 compares determination subject data DQ, which is output from the internal circuit 1, with its expected value EX to generate a comparison determination result TR. The employment of the expected value EX eliminates the necessity for matching the data rate of the data DQ output from the internal circuit 1 with the data rate of an external tester and shortens test time.

Figure 5:
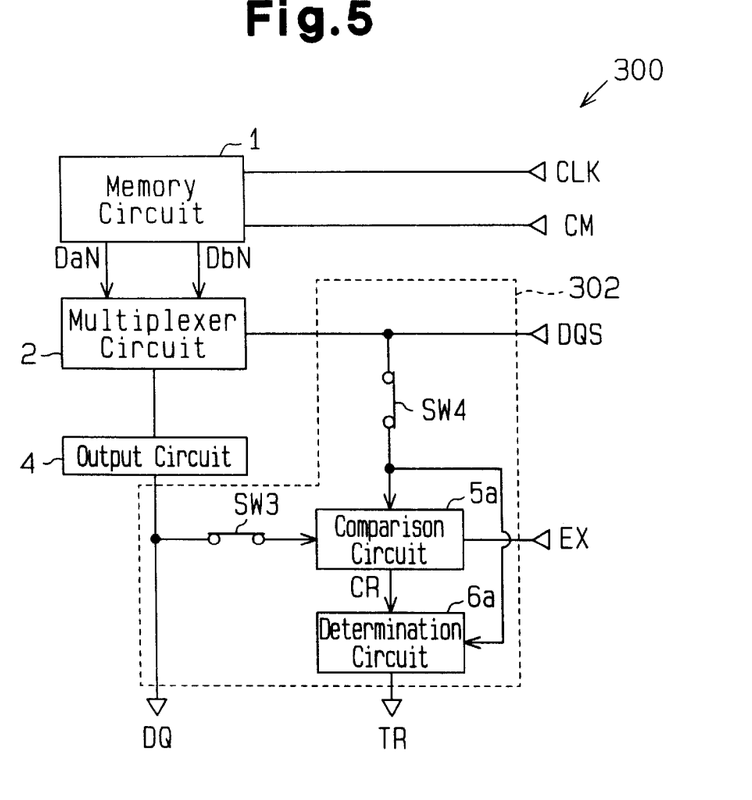
FIG. 5 is a schematic block diagram of a semiconductor memory having a test circuit according to a second embodiment of the present invention.

With reference to FIG. 5, a DDR-SDRAM 300 according to a second embodiment of the present invention includes a memory circuit 1, a multiplexer circuit 2, an output circuit 4, and a test circuit 302. The test circuit 302 has switch circuits SW3, SW4, a comparison circuit 5a, and a determination circuit 6a. The switch circuits SW3, SW4 form a test mode switching circuit and become conductive during the test mode.

The memory circuit 1 receives a reference clock signal CLK and an operation control signal CM, which includes a read command. Data DaN, DbN (N=1, 2, . . . ) is read from the memory circuit 1 in correspondence with the reference clock signal CLK and the read command. The read data is provided to the multiplexer circuit 2.

The multiplexer circuit 2 alternately provides the read data DaN, DbN to the output circuit 4 in correspondence with the second reference clock signal DQS. The output circuit 4 outputs the read data DaN, DbN as the output data DQ.

The output data DQ is provided to the comparison circuit 5a via the switch circuit SW3. The second reference clock signal DQS is provided to the comparison circuit 5a via the switch circuit SW4. During the test mode, the comparison circuit 5a is also provided with data of the expected value EX, which is identical to the data prewritten to the memory circuit 1. The comparison circuit 5a compares the output data DQ with the expected value EX and provides the comparison result CR to the determination circuit 6a.

The determination circuit 6a receives the second reference clock signal DQS via the switch circuit SW4. The determination circuit 6a provides an external tester with a determination result TR based on the second reference clock signal DQS and the comparison result CR.

Figure 6:
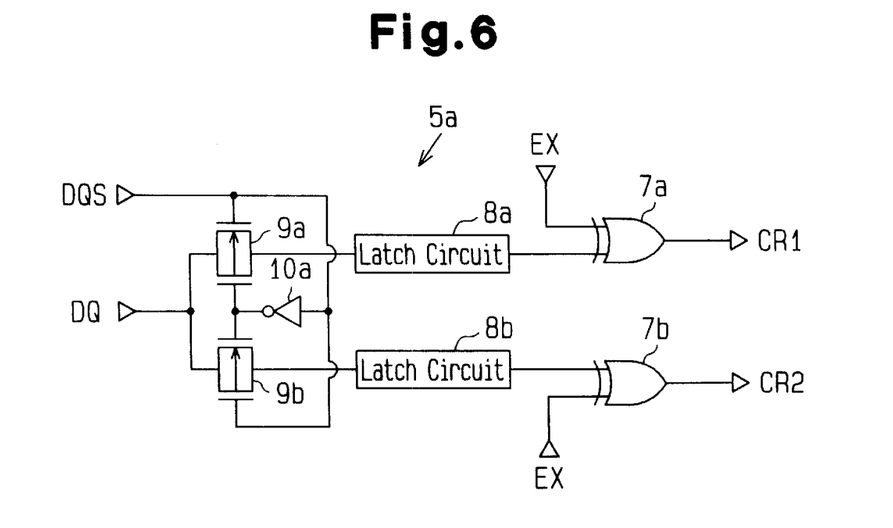
FIG. 6 is a schematic circuit diagram of a comparison circuit of the test circuit of FIG. 5.

With reference to FIG. 6, the comparison circuit 5a includes transfer gates 9a, 9b, latch circuits 8a, 8b, and EOR circuits 7a, 7b. The latch circuit 8a receives output data DQ via the transfer gate 9a, and the latch circuit 8b receives output data DQ via the transfer gate 9b. The transfer gates 9a, 9b and the latch circuits 8a, 8b form a serial-parallel conversion circuit.

The second reference clock signal DQS is provided to the n-channel gate of the transfer gate 9a and the p-channel gate of the transfer gate 9b. The second reference clock signal DQS is also received by the p-channel gate of the transfer gate 9a and the n-channel gate of the transfer gate 9b via an inverter 10a. When the second reference clock signal DQS goes high, the transfer gate 9a becomes conductive and the transfer gate 9b becomes non-conductive.

The output signal of the latch circuit 8a is provided to a first input terminal of the EOR circuit 7a, and the expected value EX is provided to a second input terminal of the EOR circuit 7a. A comparison result CR1 is output from the EOR circuit 7a.

The output signal of the latch circuit 8b is provided to a first input terminal of the EOR circuit 7b, and the expected value EX is provided to a second input terminal of the EOR circuit 7b. A comparison result CR2 is output from the EOR circuit 7b.

When the read data DaN, DbN is output alternately from the output circuit 4, read data DaN is latched by the latch circuit 8a and read data DbN is latched by the latch circuit 8b in correspondence with the leading edge and trailing edge of the second reference clock signal DQS.

The EOR circuit 7a compares the output signal of the latch circuit 8a with the expected value EX. When the output signal of the latch circuit 8a matches the expected value EX, the comparison signal CR1 output from the EOR circuit 7a goes low. The EOR circuit 7b compares the output signal of the latch circuit 8b with the expected value EX. When the output signal of the latch circuit 8b matches the expected value EX, the comparison signal CR2 output from the EOR circuit 7b goes low. The comparison results of the EOR circuits 7a, 7b each go high when the expected value EX does not match the output signal of the associated latch circuit.

Figure 7:
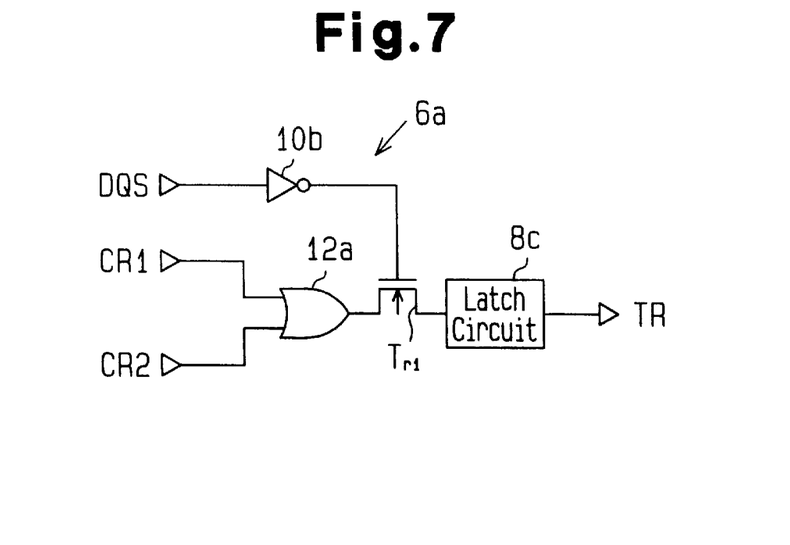
FIG. 7 is a schematic circuit diagram of a determination circuit of the test circuit of FIG. 5.

With reference to FIG. 7, the determination circuit 6a includes an OR circuit 12a, a latch circuit 8c, an n-channel MOS transistor Tr1 and an inverter 10b. The OR circuit 12a receives the comparison results CR1, CR2 from the comparison circuit 5a and provides an OR logic output signal to the latch circuit 8c via the NMOS transistor Tr1. The latch circuit 8c outputs the determination result TR. The gate of the transistor Tr1 receives the second reference clock signal DQS via the inverter 10b.

In the determination circuit 6a, when the comparison results CR1, CR2 output from the comparison circuit 5a go low, the signal output from the OR circuit 12a goes low. If any one of the comparison results CR1, CR2 goes high, the signal output from the OR circuit 12a goes high.

When the second reference clock signal DQS goes low, the OR logic output signal is latched by the latch circuit 8c. The determination signal TR is output from the latch circuit 8c.

The operation of the test circuit 302 of the DDR-SDRAM will now be discussed with reference to FIG. 8.

Cell information, such as the value of "1", is written to each memory cell of the memory circuit 1 before starting a test. When a test mode is set, the switch circuits SW3, SW4 become conductive.

In this state, the memory circuit 1 receives the reference clock signal CLK and the read control signal Read. After a predetermined latency RL (in this case, RL=2) elapses from when the memory circuit 1 acquires the read control signal, the multiplexer circuit 2 is provided with the second reference clock signal DQS. The multiplexer circuit 2 alternately provides the output circuit 4 with data DaN, DbN read from the memory circuit 1 in response to the leading edge and trailing edge of the second reference clock signal DQS. The output circuit 4 outputs the read data DaN, DbN as the output data DQ.

The transfer gates of the comparison circuit 5a become conductive and non-conductive in response to the leading edge and trailing edge of the second reference clock signal DQS. The latch circuits 8a, 8b respectively latch the read data DaN, DbN that passes through the transfer gates 9a, 9b.

The read data DaN, DbN latched by the latch circuits 8a, 8b and the expected value EX are compared by the EOR circuits 7a, 7b. The comparison results CR1, CR2 are output from the EOR circuit 7a, 7b, respectively. In this case, the comparison result CR2 is output delayed from the comparison result CR1 by one-half cycle of the second reference clock signal DQS.

The expected value EX is high, as is the data prewritten to the memory circuit 1. Thus, if the read data DaN, DbN are high, the comparison results CR1, CR2 go low.

The OR circuit 12a of the determination circuit 6a is provided with the comparison results CR1, CR2. The OR circuit 12a outputs the determination result TR in response to the trailing edge of the second reference clock signal DQS. In this case, when the comparison results CR1, CR2 are both low, the determination result TR goes low.

Figure 8:
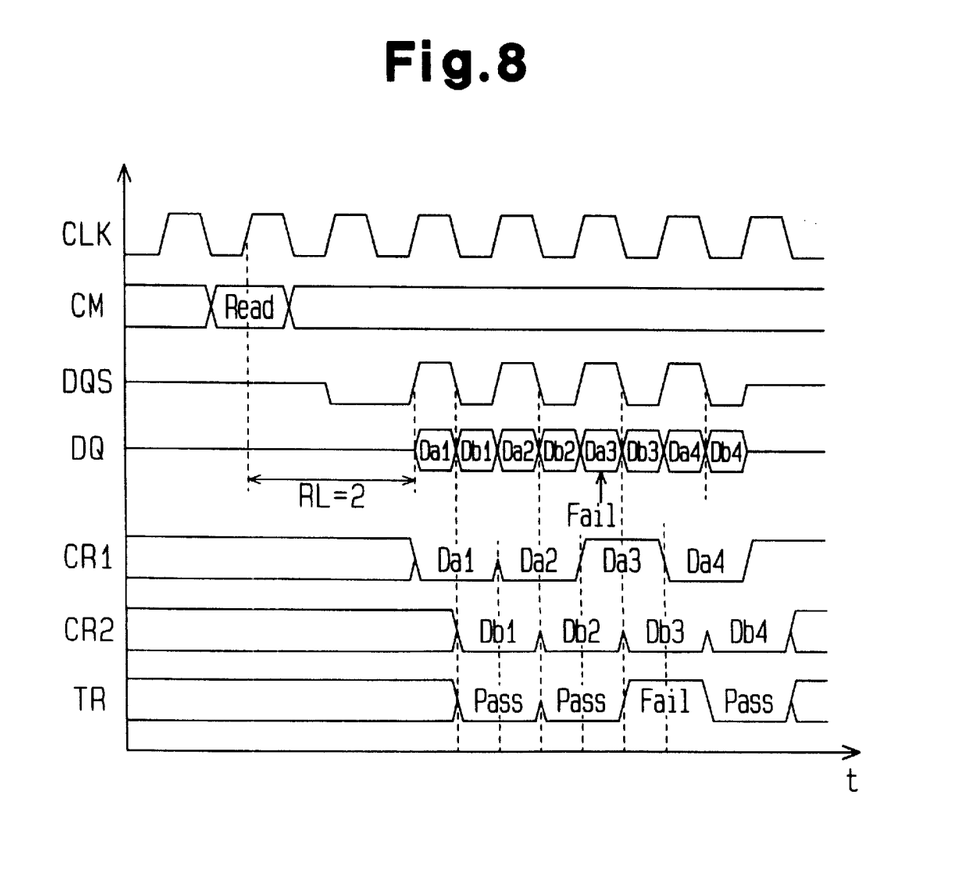
FIG. 8 is a chart showing waveforms of signals in the test circuit of FIG. 5.

With reference to FIG. 8, for example, when the EOR circuit 7a is provided with read data Da3, which is low and has an error, and the second reference clock signal DQS goes high, the comparison signal CR1 output from the EOR circuit 7a goes high. As a result, the determination result TR goes high when the second reference clock signal DQS goes low. Based on the high determination result TR, the tester detects abnormal functioning of the DDR-SDRAM 300.

The test circuit 302 of the DDR-SDRAM 300 of the second embodiment has the advantages described below.

(1) The test circuit 302 eliminates the necessity for decreasing the data rate of an external device in correspondence with the data reading rate of the DDR-SDRAM 300.

(2) The DDR-SDRAM 300 is tested at the normal data rate. Thus, the data rate of the external tester does not have to be increased.

(3) The test circuit 302 has a relatively small circuit area. Thus, the circuit area of the DDR-SDRAM 300 does not have to be increased.

Figure 9:
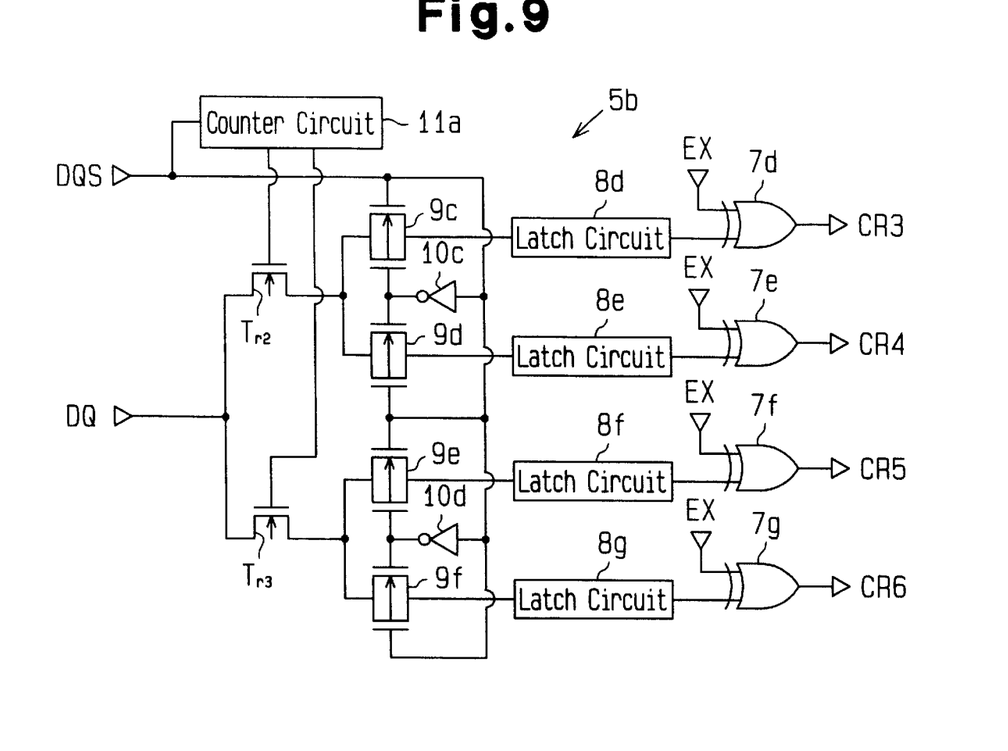
FIG. 9 is a schematic circuit diagram of a comparison circuit of a test circuit according to a third embodiment of the present invention.

With reference to FIG. 9, a comparison circuit 5b of a test circuit according to a third embodiment of the present invention includes transfer gates 9c, 9d, 9e, 9f, inverters 10c, 10d, latch circuits 8d, 8e, 8f, 8g, and EOR circuits 7d, 7e, 7f, 7g. The configuration of the comparison circuit 5b is equivalent to two sets of the comparison circuit 5a. The transfer gates 9c, 9d receive output data DQ via an n-channel MOS transistor Tr2. The transfer gates 9e, 9f receive output data DQ via an n-channel MOS transistor Tr3.

The gates of the transistors Tr2, Tr3 receive a counter output signal from a counter circuit 11a. The counter circuit 11a counts the second reference clock signal DQS and outputs the counter output signal so that the transistors Tr2, Tr3 are alternately activated every other cycle of the second reference clock signal DQS.

The comparison circuit 5b is provided with the output data DQ and the second reference clock signal DQS. When the second reference clock signal DQS does high, the latch circuit 8d latches the read data Da1. Then, when the second reference clock signal DQS goes low, the latch circuit 8e latches the read data Db1. Next, when the second reference clock signal DQS goes high, the latch circuit 8f latches read data Da2. Then, when the second reference clock signal DQS goes low, the latch circuit 8g latches read data Db2.

Accordingly, the latching of the read data is shifted among the latch circuits 8d–8g every half cycle of the second reference clock signal DQS. The read data latch period of each latch circuit is two cycles of the second reference clock signal DQS. The read data latched by the latch circuits 8d–8g is compared with the expected value EX by the associated EOR circuits 7d–7g. Comparison results CR3–CR6 are output from the EOR circuits 7d–7g, respectively.

A determination circuit, which is preferably a four input OR circuit, receives the comparison results CR3–CR6 of the comparison circuit 5b and outputs the determination result TR.

In a test circuit according to a third embodiment of the present invention, the latch circuits 8d–8g generate latched output signals having frequencies that are half of those of the latched output signals of the latches 8a, 8b (FIG. 6). Thus, the comparison and determination operations are performed in a further stable manner.

Figure 10:
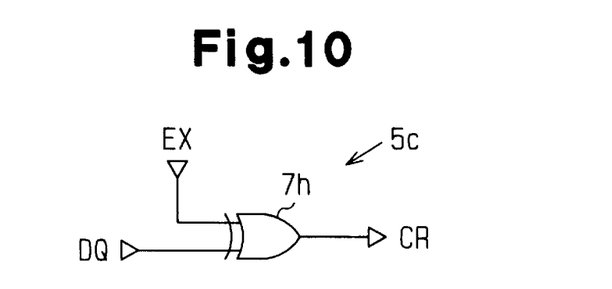
FIG. 10 is a schematic circuit diagram of a comparison circuit of a test circuit according to a fourth embodiment of the present invention.

With reference to FIG. 10, a comparison circuit 5c of a test circuit according to a fourth embodiment of the present invention may include an EOR circuit 7h. The EOR circuit 7h compares read data DQ, which is received from the output circuit 4, with the expected value EX and outputs a comparison result CR. The comparison result CR output from the comparison circuit 5c goes low when the read data DQ and the expected value EX are matched and goes high when the read data DQ and the expected value EX do not match.

Figure 11:
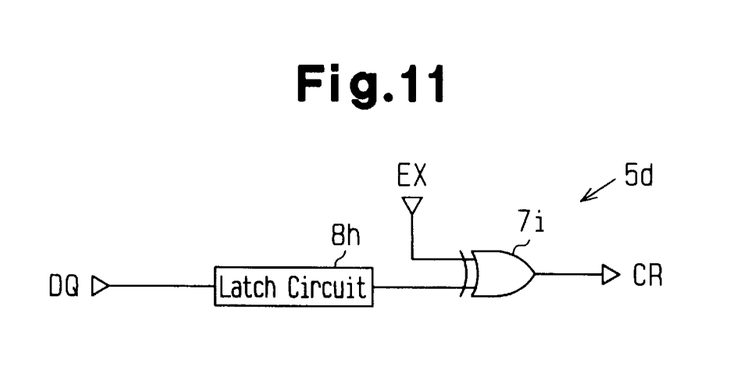
FIG. 11 is a schematic circuit diagram of a further comparison circuit of the test circuit according to the fourth embodiment of the present invention.

A comparison circuit 5d such as that of FIG. 11 may be used in lieu of the comparison circuit 5c. The comparison circuit 5d includes a latch circuit 8h and an EOR circuit 7i. The EOR circuit 7i compares read data DQ, which is received from the output circuit 4 via the latch circuit 8h, with the expected value EX and outputs a comparison result CR. The latch circuit 8h stabilizes the comparison of the EOR circuit 7i. The second reference clock signal DQS is not provided to the comparison circuits 5c, 5d.

A test circuit according to a fourth embodiment of the present invention includes a determination circuit 6b (FIG. 12) and either the comparison circuit 5c of FIG. 10 or the comparison circuit 5d of FIG. 11. The determination circuit 6b includes a serial-parallel conversion circuit and a determination section connected to the serial-parallel conversion circuit. The determination circuit 6b receives the comparison result CR from the comparison circuit 5c or 5d. The comparison result CR is provided to a latch circuit 8i via a transfer gate 9g and to a latch circuit 8j via a transfer gate 9h.

Figure 12:
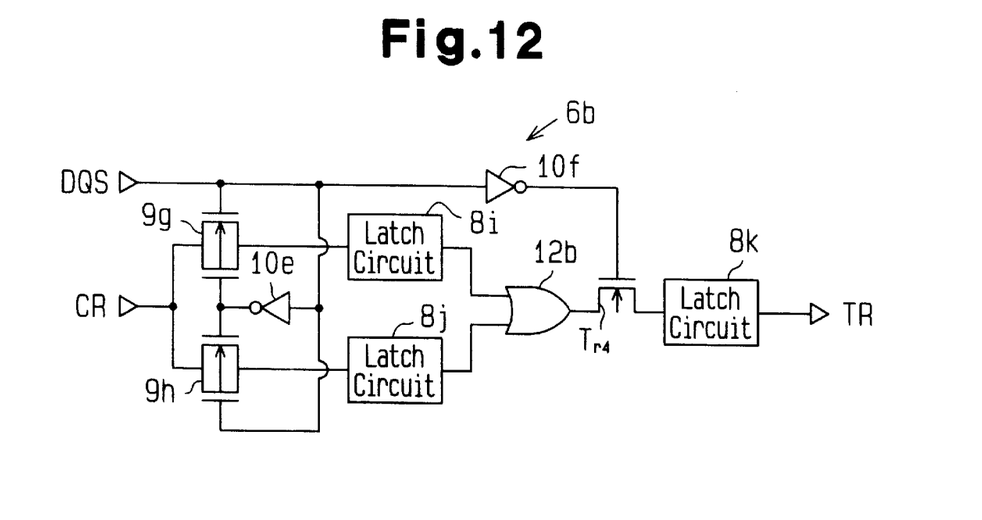
FIG. 12 is a schematic circuit diagram of a determination circuit of the test circuit according to the fourth embodiment of the present invention.

The second reference clock signal DQS is provided to the n-channel gate of the transfer gate 9g and the p-channel gate of the transfer gate 9h. The second reference clock signal DQS is also provided via an inverter 10e to the p-channel gate of the transfer gate 9g and the n-channel gate of the transfer gate 9h.

When the second reference clock signal DQS goes high, the transfer gate 9g becomes conductive and the transfer gate 9h becomes non-conductive. When the second reference clock signal DQS goes low, the transfer gate 9h becomes conductive and the transfer gate 9g becomes non-conductive.

The latched output signals of the latch circuits 8i, 8j are provided to the OR circuit 12b. The OR logic output signal of the OR circuit 12b is provided to a latch circuit 8k via an n-channel MOS transistor Tr4. The latch circuit 8k outputs a determination result TR. The gate of the transistor Tr4 is provided with the second reference clock signal DQS via an inverter 10f.

In the determination circuit 6b, when the second reference clock signal DQS goes high, the transfer gate 9g becomes conductive and the transfer gate 9h becomes non-conductive. This provides the comparison result CR to the latch circuit 8i via the transfer gate 9g, and the latch circuit 8i provides the latched comparison result CR to the OR circuit 12b.

When the second reference clock signal DQS goes low, the transfer gate 9h becomes conductive, and the transfer gate 9g becomes non-conductive. This provides the comparison result CR to the latch circuit 8j via the transfer gate 9h, and the comparison result CR latched by the latch circuit 8j is provided to the OR circuit 12b.

The OR circuit 12b outputs the OR logic signal of the comparison results CR latched by the latch circuits 8i, 8j.

When the second reference clock signal DQS goes low, the transistor Tr4 becomes active, the latch circuit 8k latches the OR logic output signal of the OR circuit 12b, and the latch circuit 8k outputs the determination result TR.

In the test circuit of the fourth embodiment, the read data DaN, DbN and the expected value EX are compared by the comparison circuit 5c or the comparison circuit 5d, and the comparison result CR is provided to the determination circuit 6b. In the determination circuit 6b, the comparison result CR of the read data DaN, DbN is sequentially latched by the latch circuits 8i, 8j, and the latched comparison results CR are provided to the OR circuit 12b. As long as the latched comparison results are both low, the OR logic output signal generated by the OR circuit 12b is low. When the second reference clock signal DQS goes low, the OR logic output signal is output from the latch circuit 8k as the determination result TR.

A test circuit according to a fifth embodiment of the present invention includes a determination circuit 6c (FIG. 13) and the comparison circuit 5c of FIG. 10 or the comparison circuit 5d of FIG. 11.

Figure 13:
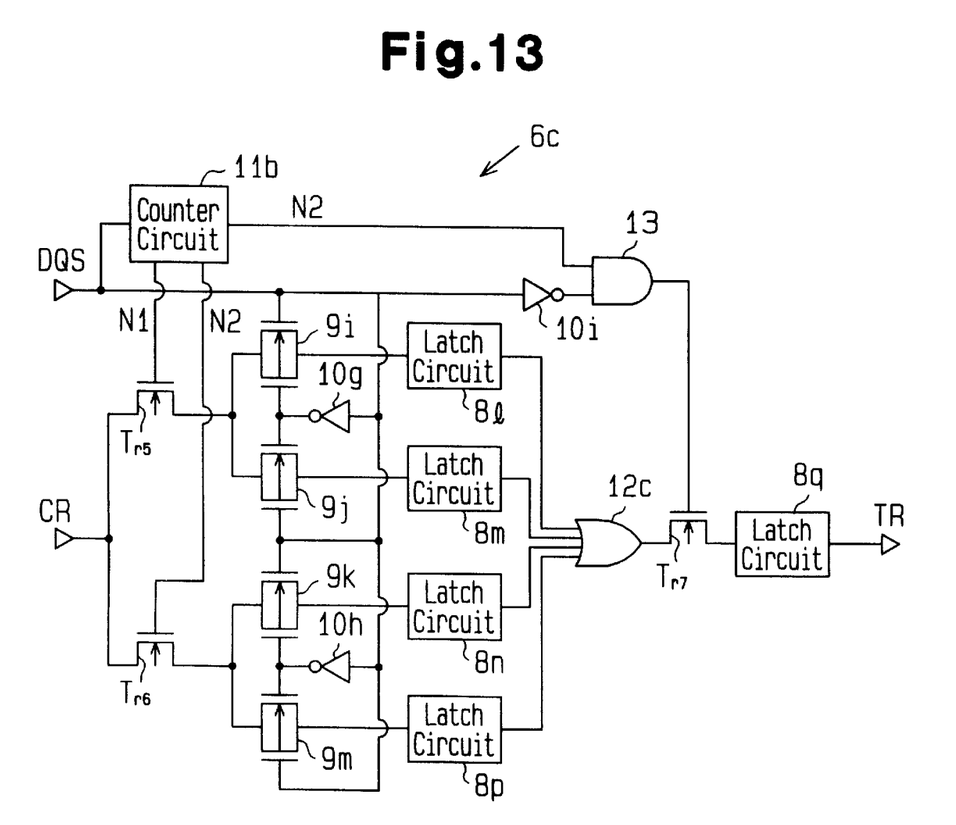
FIG. 13 is a schematic circuit diagram of a determination circuit of a test circuit according to a fifth embodiment of the present invention.

The determination circuit 6c includes a counter circuit 11b, transistors Tr5, Tr6, transfer gates 9i, 9j, 9k, 9m, inverters 10g, 10h, and latch circuits 8l, 8m, 8n, 8p, 8q. The determination circuit 6c functions in the same manner as the comparison circuit 5b of FIG. 9.

The comparison results CR latched by the latch circuits 8l, 8m, 8n, 8p are provided to the OR circuit 12c. The logic output signal of the OR circuit 12c is provided to the latch circuit 8q via an n-channel MOS transistor Tr7.

Count signals N1, N2 having a high level are alternately output from the counter circuit 11b each time a pulse of the second reference clock signal DQS is counted to alternately activate the transistors Tr5, Tr6.

The count signal N2 is provided to a first input terminal of the AND circuit 13. The second reference clock signal DQS is provided to a second input terminal of the AND circuit 13 via an inverter 10i. The AND logic output signal of the AND circuit 13 is provided to the gate of the transistor Tr7.

When the count signal N2 of the counter circuit 11b is high and the second reference clock signal DQS goes low, the AND logic output signal of the AND circuit 13 goes high and activates the transistor Tr7. This causes the latch circuit 8q to latch the OR logic output signal of the OR circuit 12c. The latch circuit 8q outputs the determination signal TR.

Figure 14:
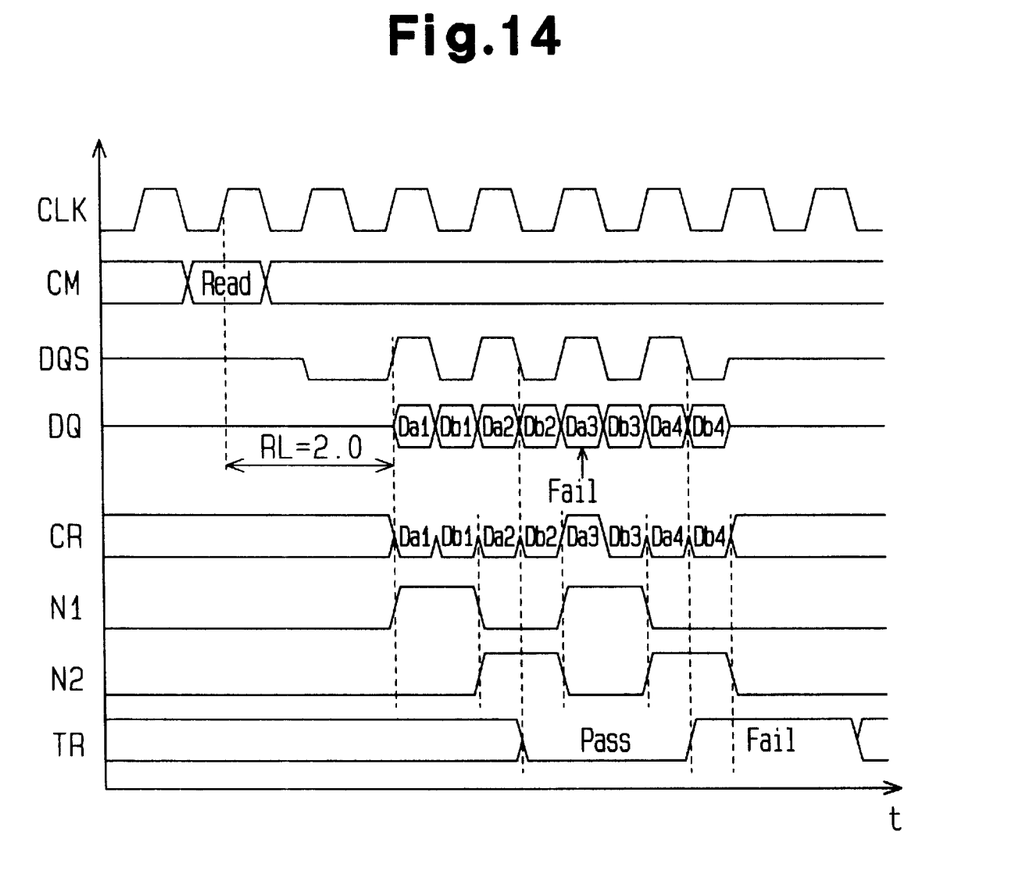
FIG. 14 is a chart showing waveforms of signals in the test circuit of the fifth embodiment.

The operation of the test circuit of the fifth embodiment will now be discussed with reference to FIG. 14. When entering the test mode, the output circuit 4 outputs read data DaN, DbN as output data.

The read data DaN, DbN are compared with the expected value EX by the comparison circuit 5c or 5d. The comparison result CR is provided to the determination circuit 6c.

In the determination circuit 6c, the transistors Tr5, Tr6, which respectively function in accordance with the count signals N1, N2 of the counter circuit 11b, and the transfer gates 9i–9m, which function in accordance with the second reference clock signal DQS, cause the latch circuits 8l, 8m, 8n, 8p to sequentially latch the comparison result CR. The latched output signals of the latch circuits 8l, 8m, 8n, 8p are provided to the OR circuit 12c. The OR logic output signal is output from the OR circuit 12c.

When the count signal N2 is high and the second reference clock signal DQS goes low, the OR logic output signal of the OR circuit 12c is latched by the latch circuit 8q, and the determination result TR is output from the latch circuit 8q. In this manner, when the determination circuit 6c is continuously provided with the low comparison result CR, the determination result TR remains low.

For example, if the read data Da3 goes low due to an error, the comparison result CR of the read data Da3 goes high. The high comparison result CR is latched by the latch circuit 8l. Then, when the count signal N2 goes high and the second reference clock signal DQS goes low, the determination result TR output from the latch circuit 8q goes high. The tester detects abnormal functioning of the DDR-SDRAM based on the high determination result TR.

The test circuit of the DDR-SDRAM of the fifth embodiment has the advantages described below.

(1) The frequency of the latched output signals of the latch circuits 8l, 8m, 8n, 8p is one half the frequency of the latched output signals of the latch circuits 8a, 8b of FIG. 6. Accordingly, the determination operation is performed more stably.

(2) The output frequency of the determination signal TR is one-eighth the output data-rate of the output data DQ and one-fourth the frequency of the second reference clock signal DQS. This ensures the determination of abnormal functioning by the external tester.

Figure 15:
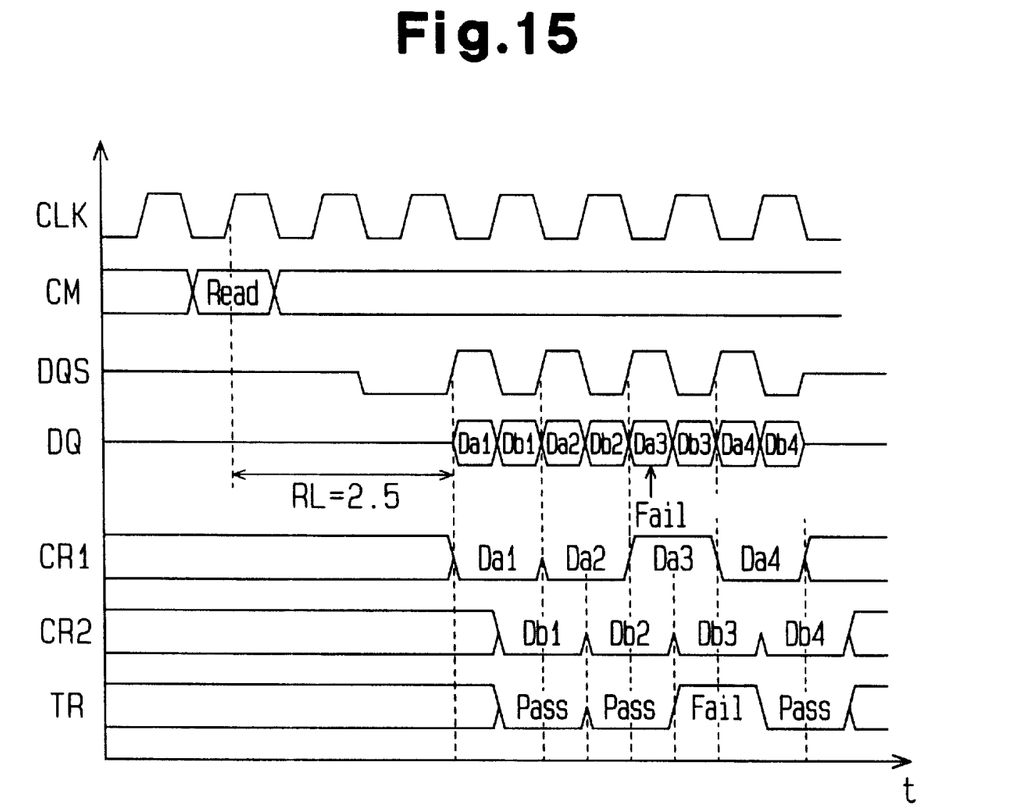
FIG. 15 is a chart showing waveforms of signals in a test circuit according to a sixth embodiment of the present invention.

FIG. 15 is a chart showing the waveforms of signals in a test circuit according to a sixth embodiment of the present invention. In the sixth embodiment, the read latency RL of the memory circuit 1 is set at 2.5. The test circuit 302 of FIG. 5 is employed as the test circuit of the sixth embodiment.

The comparison circuit 5a and the determination circuit 6a function in accordance with the second reference clock signal DQS regardless of the reference clock signal CLK. Thus, the comparison circuit 5a and the determination circuit 6a function in the same manner as in the second embodiment, even if the read latency RL changes.

Accordingly, regardless of the read latency RL of the memory circuit 1, the test circuit 302 functions stably. Further, the test circuits of the third to fifth embodiment also function stably regardless of the read latency of the memory circuit 1.

Figure 16:
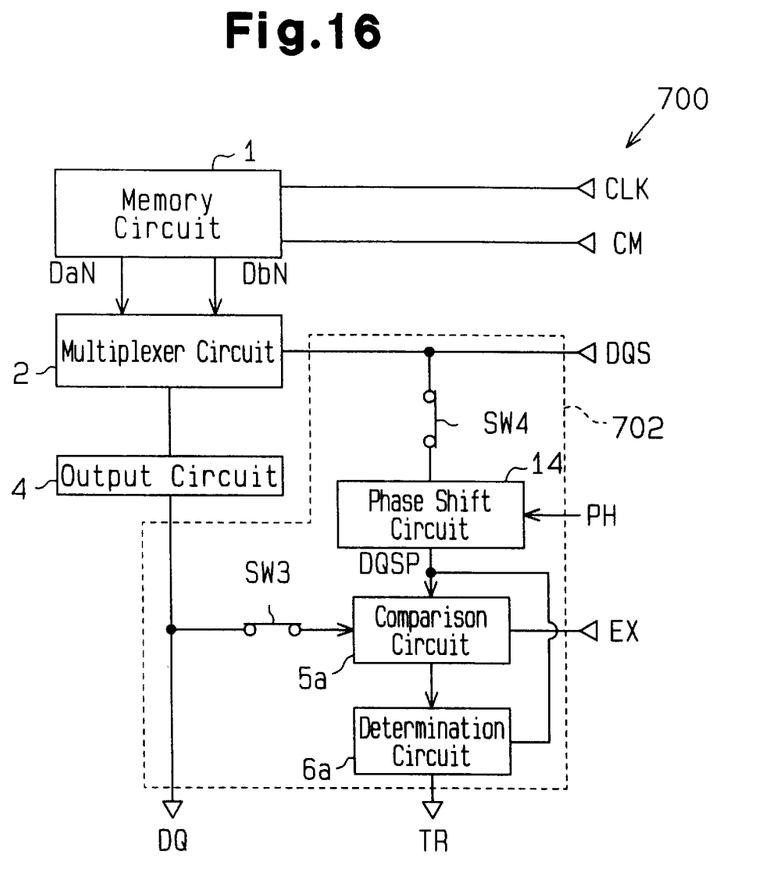
FIG. 16 is a schematic block diagram of a semiconductor memory having a test circuit according to a seventh embodiment of the present invention.

With reference to FIG. 16, a test circuit according to a seventh embodiment of the present invention includes a comparison circuit 5a, a determination circuit 6a, and a phase shift circuit 14. The second reference clock signal DQS is provided to the comparison circuit 5a and the determination circuit 6a via the phase shift circuit 14.

Figure 17:
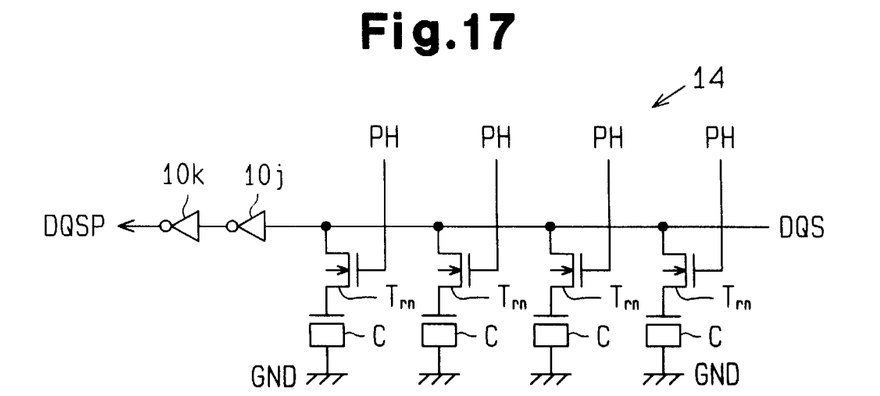
FIG. 17 is a schematic circuit diagram of a phase shift circuit of the test circuit of FIG. 16.

With reference to FIG. 17, the phase shift circuit 14 includes inverters 10k, 10j, a plurality of n-channel MOS transistors Trn, and a plurality of capacitors C. The second reference clock signal DQS is provided to the inverter 10j. The input terminal of the inverter 10j is connected to the drains of the NMOS transistors Trn. The sources of the transistors Trn are connected to the ground GND via the associated capacitors C.

The gates of the transistors Trn are provided with a phase control signal PH. The phase control signal PH is generated by, for example, an external tester to select the transistor Trn that is to be activated.

The output signal of the inverter 10j is output as the phase shift signal DQSP via the inverter 10k.

In the phase shift circuit 14, the phase control signal PH adjusts the number of transistors Trn that are to be activated and the capacity of the input terminal of the inverter 10j. In accordance with the capacity of the input terminal of the inverter 10j, the phase shift signal DQSP is delayed relative to the second clock signal DQS. That is, the time delay of the phase shift signal DQSP is adjusted by adjusting the capacity of the input terminal of the inverter 10j.

Figure 18:
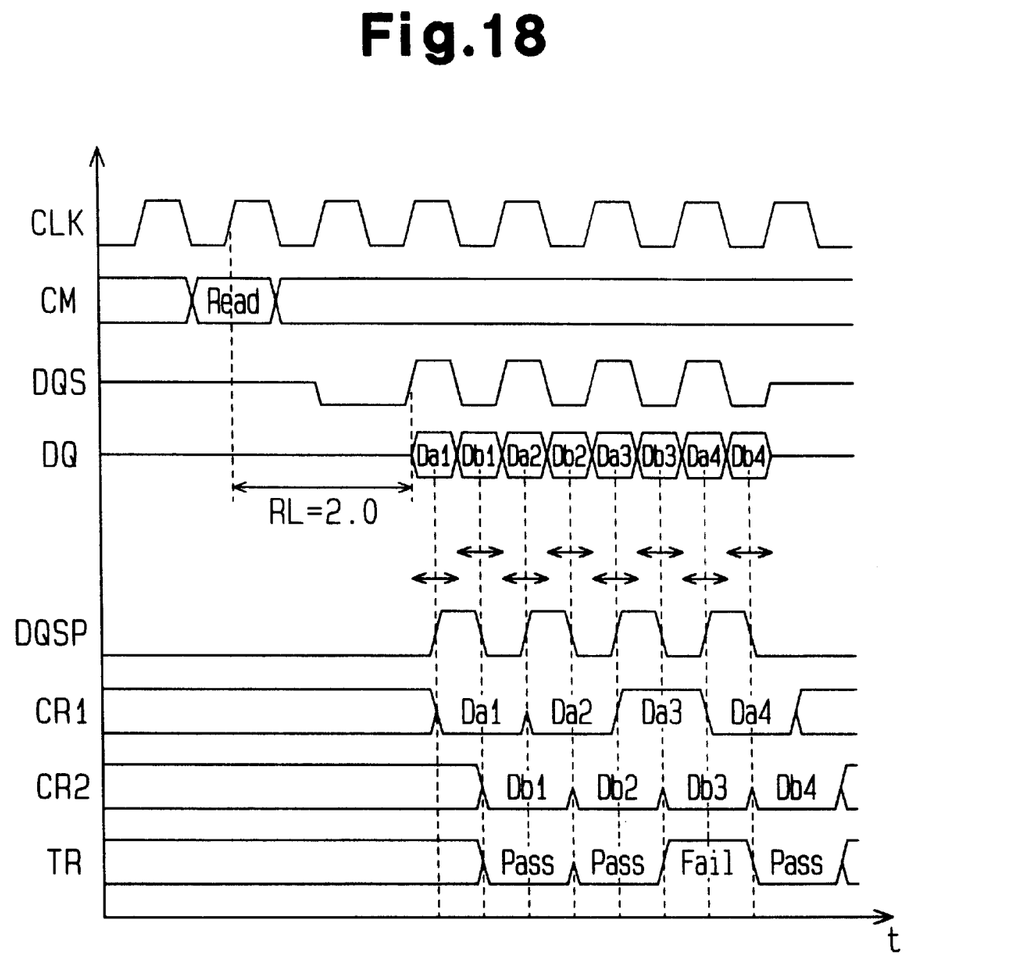
FIG. 18 is a chart showing waveforms of signals in the test circuit of FIG. 16.

With reference to FIG. 18, by adjusting the time delay of the phase shift signal DQSP, the timing for latching the read data DaN, DbN of the comparison circuit 5a is changed. Thus, by adjusting the time delay of the phase shift signal DQSP, the range that enables normal output of the low determination signal TR is detected. The detection enables measurement of the data output period of data DaN, DbN.

It should be apparent to those skilled in the art that the present invention may be embodied in many other specific forms without departing from the spirit or scope of the invention. Particularly, it should be understood that the present invention may be embodied in the following forms.

In addition to a DDR-SDRAM, a test circuit according to the present invention may be applied to a semiconductor device that outputs data at a high speed.

The present examples and embodiments are to be considered as illustrative and not restrictive, and the invention is not to be limited to the details given herein, but may be modified within the scope and equivalence of the appended claims.

What is claimed is:

1. A semiconductor device comprising:
   an internal circuit for generating data;
   an I/O circuit for receiving the data and outputting output data in correspondence with a rising edge and a falling edge of a reference clock signal; and
   a comparison determination circuit for receiving the output data, comparing the output data with an expected data value, and generating determination result data in correspondence with the rising edge and the falling edge of the reference clock signal.

2. The semiconductor device according to claim 1, wherein the comparison determination circuit includes:
   a comparison circuit for comparing the output data of the internal circuit with the expected data value to generate comparison result data; and
   a determination circuit connected to the comparison circuit for determining whether the output data of the internal circuit is correct based on the comparison result data to generate the determination result data.

3. The semiconductor device according to claim 2, wherein the comparison circuit includes:
   a serial-parallel conversion circuit for receiving the output data of the internal circuit as serial data and converting the serial data to parallel data in correspondence with the reference clock signal; and
   a comparator for receiving the parallel data from the serial-parallel conversion circuit and comparing the parallel data with the expected data value to generate the comparison result data, wherein the determination circuit outputs the determination result data in synchronism with the reference clock signal.

4. The semiconductor device according to claim 3, wherein the serial-parallel conversion circuit includes:
   a pair of switch circuits that alternately become conductive in correspondence with the reference clock signal to output the parallel data; and
   a pair of latch circuits connected to the pair of switch circuits for latching the parallel data to generate latched parallel data.

5. The semiconductor device according to claim 3, wherein the serial-parallel conversion circuit includes:
   a first set of switch circuits that alternately become conductive in correspondence with the reference clock signal to output first parallel data;
   a second set of switch circuits that alternately become conductive in correspondence with the reference clock signal to output second parallel data;

a first set of latch circuits connected to the first set of switch circuits for latching the first parallel data to generate latched first parallel data;

a second set of latch circuits connected to the second set of switch circuits for latching the second parallel data to generate latched second parallel data; and a selection circuit connected to the first and second switch circuits to select one of the first and second switch circuits in correspondence with a count signal of the reference clock signal and to provide the selected set of switch circuits with the output data of the internal circuit.

6. The semiconductor device according to claim 2, wherein the comparison circuit includes a comparator for receiving the output data of the internal circuit as serial data and comparing the serial data with the expected data value to generate serial comparison result data, and wherein the determination circuit includes:

a serial-parallel conversion circuit connected to the comparator for converting the serial comparison result data to parallel comparison result data in correspondence with the reference clock signal; and a determination section connected to the serial-parallel conversion circuit for determining whether the output data of the internal circuit is correct based on the parallel comparison result data and for outputting the determination result data in synchronism with the reference clock signal.

7. The semiconductor device according to claim 6, wherein the comparison circuit further includes a latch circuit connected to the comparator for latching the output data of the internal circuit and providing the comparator with the latched output data.

8. The semiconductor device according to claim 6, wherein the serial-parallel conversion circuit includes:

a pair of switch circuits that alternately become conductive in correspondence with the reference clock signal to output the parallel comparison result data; and a pair of latch circuits connected to the pair of switch circuits for latching the parallel comparison result data to generate latched parallel comparison result data.

9. The semiconductor device according to claim 6, wherein the serial-parallel conversion circuit includes:

a first set of switch circuits that alternately become conductive in correspondence with the reference clock signal to output first parallel comparison result data;

a second set of switch circuits that alternately become conductive in correspondence with the reference clock signal to output second parallel comparison result data;

a first set of latch circuits connected to the first set of switch circuits for latching the first parallel comparison result data to generate latched first parallel comparison result data;

a second set of latch circuits connected to the second set of switch circuits for latching the second parallel comparison result data to generate latched second parallel comparison result data; and a selection circuit connected to the first and second switch circuits to select one of the first and second switch circuits in correspondence with a count value of the reference clock signal and to provide the selected set of switch circuits with the comparison result data.

10. The semiconductor device according to claim 2, further comprising a phase shift circuit connected to the comparison circuit and the determination circuit for receiving the reference clock signal, shifting the phase of the reference clock signal, and providing the comparison circuit and the determination circuit with the phase-shifted reference clock signal.

11. The semiconductor device according to claim 1, wherein the internal circuit is a memory circuit of a double data rate (DDR)-SDRAM, and the output data of the internal circuit is data read by the DDR-SDRAM.

12. A semiconductor device comprising:

an internal circuit for generating data in correspondence with a first reference clock signal;

an I/O circuit for receiving the data and outputting output data in correspondence with a rising edge and a falling edge of a second reference clock signal; and a comparison determination circuit for receiving the output data, comparing the output data with an expected data value, and generating determination result data in correspondence with the rising edge and the falling edge of the second reference clock signal.

* * * * *